(12) United States Patent
Byeon et al.

(10) Patent No.: US 7,439,797 B2
(45) Date of Patent: Oct. 21, 2008

(54) SEMICONDUCTOR DEVICE INCLUDING A HIGH VOLTAGE GENERATION CIRCUIT AND METHOD OF GENERATING A HIGH VOLTAGE

(75) Inventors: Dae-Seok Byeon, Yongin-si (KR); Dong-Hyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 174 days.

(21) Appl. No.: 11/605,223

(22) Filed: Nov. 29, 2006

(65) Prior Publication Data

US 2008/0079503 A1    Apr. 3, 2008

(30) Foreign Application Priority Data

Sep. 28, 2006    (KR) ...................... 10-2006-0094799

(51) Int. Cl.
G05F 1/46    (2006.01)
(52) U.S. Cl. .................. 327/540; 327/548; 365/226
(58) Field of Classification Search ................ 327/530, 327/538–543, 548; 365/226–229
See application file for complete search history.

(56) References Cited

U.S. PATENT DOCUMENTS

| 5,767,735 | A | 6/1998 | Javanifard et al. |
| 5,774,406 | A | 6/1998 | Kowshik |
| 5,909,140 | A | 6/1999 | Choi |
| 5,969,565 | A | 10/1999 | Naganawa |
| 6,151,230 | A | 11/2000 | Savelli |
| 6,154,411 | A | 11/2000 | Morishita |
| 6,366,519 | B1 | 4/2002 | Hung et al. |
| 6,912,159 | B2 | 6/2005 | Osawa et al. |
| 6,980,045 | B1 * | 12/2005 | Liu ............................ 327/536 |
| 6,992,517 | B2 | 1/2006 | Weiner |
| 7,176,747 | B2 | 2/2007 | Lee et al. |
| 7,221,610 | B2 | 5/2007 | Yamazoe et al. |
| 7,274,248 | B2 | 9/2007 | Okamoto |
| 2002/0008566 | A1 | 1/2002 | Taito et al. |

FOREIGN PATENT DOCUMENTS

JP    2005-080395    3/2005

* cited by examiner

*Primary Examiner*—David Mis
(74) *Attorney, Agent, or Firm*—Volentine & Whitt, PLLC

(57) ABSTRACT

A semiconductor memory device includes a first pump clock generator configured to generate a first pump clock signal based on a power supply voltage. The device also includes a first charge pump configured to generate a first pump output voltage in response to the first pump clock signal. The device also includes a second pump clock generator configured to generate a second pump clock signal based on the first pump output voltage. The device also includes a second charge pump configured to generate a second pump output voltage in response to the second pump clock signal. The device also includes a switching unit configured to selectively connect the first charge pump to the second charge pump.

14 Claims, 5 Drawing Sheets

SEMICONDUCTOR DEVICE INCLUDING A HIGH VOLTAGE GENERATION CIRCUIT AND METHOD OF GENERATING A HIGH VOLTAGE

BACKGROUND OF THE INVENTION

1. Field of the Invention

The present invention relates generally to a semiconductor device and, more particularly, to a semiconductor device including a high voltage generation circuit and a method of generating a high voltage.

A claim of priority is made to Korean Patent Application No. 10-2006-0094799, filed on Sep. 28, 2006, in the Korean Intellectual Property Office, the disclosure of which is incorporated herein in its entirety by reference.

2. Description of the Related Art

A flash memory device is considered a non-volatile memory device in that it retains data stored when power to the device is turned off or otherwise interrupted. While many types of semiconductor memory devices utilize a single power supply unit, a flash memory device typically requires the generation of multiple internal voltage levels in order to drive different types of circuits included within the device.

For example, a program voltage for programming data in a flash memory cell and an erase voltage for erasing data from the flash memory cell are generally higher than a power supply voltage (e.g., 20V). In addition, a voltage of about 5-8 V may be needed during a read operation.

In order to obtain these voltages, the flash memory device generally includes a high voltage generation circuit. Specifically, the high voltage generation circuit generates a constant voltage. The high voltage generation circuit may be referred to as a regulator circuit and is usually implemented using a charge pump. The high voltage generation circuit may also be used to generate voltages having different levels. This may be achieved, for example, by receiving a single power such as a first power supply voltage and generating different power supply voltages having different voltage levels using the voltage regulator circuit.

For example, in a semiconductor memory device, a second voltage generation unit included in the device boosts a first voltage. This first voltage is typically provided from an external power source. The boosted first voltage may be referred to as a second voltage. Generally, the first voltage is boosted to the second voltage using a first charge pump.

The semiconductor memory device may also include a third voltage generation unit. The third voltage generation unit outputs a third voltage (e.g., a program voltage) using the second voltage and a second charge pump. Furthermore, the second voltage is higher than the externally applied first voltage and is used to control a switch which is implemented in the third voltage generation unit to enable the third voltage to attain a target level.

The third voltage generation unit also includes a resistor divider. This resistor divider usually controls the increase and the decrease of an output voltage. Furthermore, a current path for the resistor divider is controlled by a switch. In particular, the switch is connected in parallel with the resistor divider and is turned on or off in response to the second voltage generated by the second voltage generation unit and a switch enable signal.

Typically, the semiconductor memory device maintains the second voltage higher than the third voltage and uses the second voltage as a power supply voltage for driving at least one circuit included therewithin. For example, when the semiconductor memory device is a flash memory device, the switch in the second voltage generation unit is controlled by the second voltage to output the third voltage having a predetermined target level. The third voltage may be used for various tasks. For example, the third voltage may be used as a program voltage for programming data in a cell, a voltage for verifying data programmed in the cell, a voltage for erasing data from the cell, or a voltage for verifying the erasure of the data from the cell.

While the conventional semiconductor device may use different voltage generation circuits to generate different voltages at different levels, it suffers from various shortcomings. For example, when a load capacitance at an output terminal of the second voltage generation unit (e.g., a parasitic capacitance at a bus line) is greater than a load capacitance at an output terminal of the third voltage generation unit, the third voltage may increase quickly to be higher than the second voltage. This kind of increase in the third voltage may result in an overshooting of the third voltage. This overshooting of the third voltage may cause the semiconductor memory device to operate abnormally.

SUMMARY OF THE INVENTION

One aspect of the present disclosure includes a semiconductor memory device. The device includes a first pump clock generator configured to generate a first pump clock signal based on a power supply voltage. The device also includes a first charge pump configured to generate a first pump output voltage in response to the first pump clock signal. The device also includes a second pump clock generator configured to generate a second pump clock signal based on the first pump output voltage. The device also includes a second charge pump configured to generate a second pump output voltage in response to the second pump clock signal. The device also includes a switching unit configured to selectively connect the first charge pump to the second charge pump.

Another aspect of the present disclosure includes a method of generating a voltage in a semiconductor device. The method comprises generating a first pump clock signal based on a power supply voltage using a first pump clock generator. The method also comprises generating a first pump output voltage in response to the first pump clock signal using a first charge pump. The method also comprises generating a second pump clock signal based on the first pump output voltage using a second pump clock generator. The method also comprises generating a second pump output voltage in response to the second pump clock signal using a second charge pump. The method also comprises selectively connecting the first charge pump to the second charge pump.

BRIEF DESCRIPTION OF THE DRAWINGS

The above and other features of the present invention will become readily apparent from the detailed description that follows, with reference to the accompanying drawings, in which.

DETAILED DESCRIPTION OF EMBODIMENTS

Figure 1:
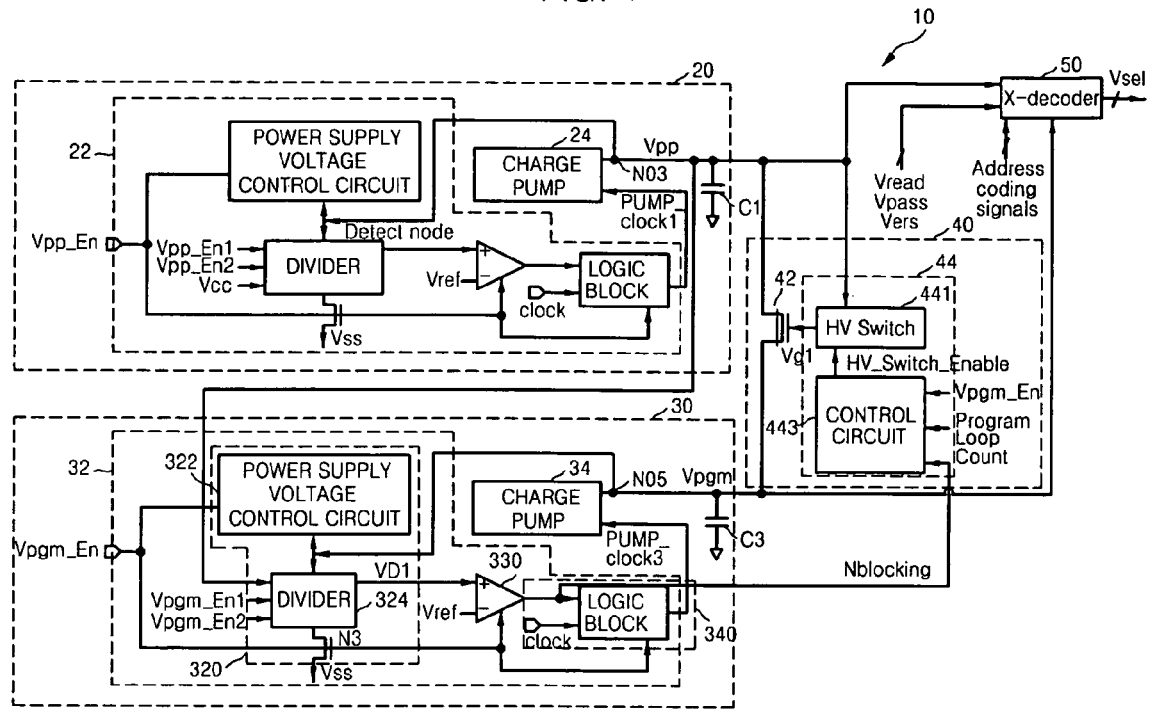
FIG. 1 is a block diagram of a semiconductor device according to an exemplary disclosed embodiment.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor device 10 according to an exemplary disclosed embodiment. Referring to FIG. 1, the semiconductor device 10 includes a first voltage generation unit 20, a second voltage generation unit 30, a switching unit 40, and a row decoder circuit (i.e., an X-decoder) 50.

The first voltage generation unit 20 generates a first pump output voltage Vpp based on a first voltage generation enable signal Vpp_En and a first power supply voltage Vcc. The first voltage generation unit 20 may include a number of components. For example, the disclosed first voltage generation unit 20 includes a first pump clock generator 22 and a first charge pump 24.

The first pump clock generator 22 generates a first pump clock signal PUMP_clock1 which controls the operation of the first charge pump 24 in response to the first voltage generation enable signal Vpp_En. Furthermore, the first charge pump 24 performs a pumping operation in response to the first pump clock signal PUMP_clock1 and generates the first pump output voltage Vpp.

The second voltage generation unit 30 generates a second pump output voltage Vpgm based on a second voltage generation enable signal Vpgm_En and the first pump output voltage Vpp. Furthermore, similar to the first voltage generation unit 20, the second voltage generation unit 30 includes a second pump clock generator 32 and a second charge pump 34.

The second pump clock generator 32 generates a second pump clock signal PUMP_clock3 for controlling the operation of the second charge pump 34 based on the first pump output voltage Vpp. In addition, the second charge pump 34 performs a pumping operation in response to the second pump clock signal PUMP_clock3 and generates the second pump output voltage Vpgm.

In order to stop the operation of the second pump clock generator 32 when the second pump output voltage Vpgm that is output from the second charge pump 34 reaches a predetermined target level, the second pump clock generator 32 is connected with an output node NO5 of the second charge pump 34. This output note NO5 is used so that the second pump clock generator 32 stops generating the second pump clock signal PUMP_clock3 when a voltage of the output node NO5 or a voltage obtained by dividing the voltage of the output node NO5 is higher than a reference voltage Vref.

While the second charge pump 34 is enabled, the second pump output voltage Vpgm is the voltage of the output node NO5. However, when the second pump clock signal PUMP_clock3 is interrupted, the second charge pump 34 is disabled and the voltage of the output node NO5 is biased to the first power supply voltage Vcc by a power supply voltage control circuit 322.

As mentioned above, the device 10 also includes the switching unit 40. In an exemplary embodiment, the switching unit 40 is connected between the first charge pump 24 and the second charge pump 34. Furthermore, the switching unit 40 connects the first charge pump 24 with the second charge pump 34 in response to a first control signal Nblocking generated by the second pump clock generator 32. The switching unit 40 may include a number of components. For example, the disclosed switching unit 40 includes a switch 42 and a switch control block 44.

The switch 42 is connected between the first charge pump 24 and the second charge pump 34. In addition the switch 42 connects the first charge pump 24 with the second charge pump 34 in response to a second control signal Vg1 generated by the switch control block 44. In an exemplary embodiment, the switch 42 may be a depletion transistor.

The switch control block 44 outputs the second control signal Vg1 for enabling the switch 42 based on the first pump output voltage Vpp and the first control signal Nblocking. The switch control block 44 may include a number of components. For example, the disclosed switch control block 44 includes a first control block and a second control block. The first control block may be a HV switch 441 and the second control block may be a control circuit 443.

The HV switch 441 outputs the second control signal Vg1 based on the first pump output voltage Vpp and a third control signal HV_Switch_Enable. The control circuit 443 outputs the third control signal HV_Switch_Enable based on the second voltage generation enable signal Vpgm_En and the first control signal Nblocking during a programming period of the semiconductor device 10, that is, while a program enable signal, i.e., a program loop count of the semiconductor device 10, is provided at a high level of "1".

The row decoder circuit 50 is connected with a memory cell array (60 in FIG. 5) and outputs at least one row line selection voltage Vsel based on an address signal (for example, address coding signals) and the first pump output voltage Vpp or the second pump output voltage Vpgm. This operation will be described in detail with reference to FIG. 5 later.

The row line selection voltage Vsel may be a read voltage Vread, a pass voltage Vpass, or an erase voltage Vers. Moreover, the read voltage Vread, the pass voltage Vpass, and the erase voltage Vers may be generated by a circuit having a structure which is the same as or similar to that of the voltage generation units 20 and 30 illustrated in FIG. 1.

Figure 2:
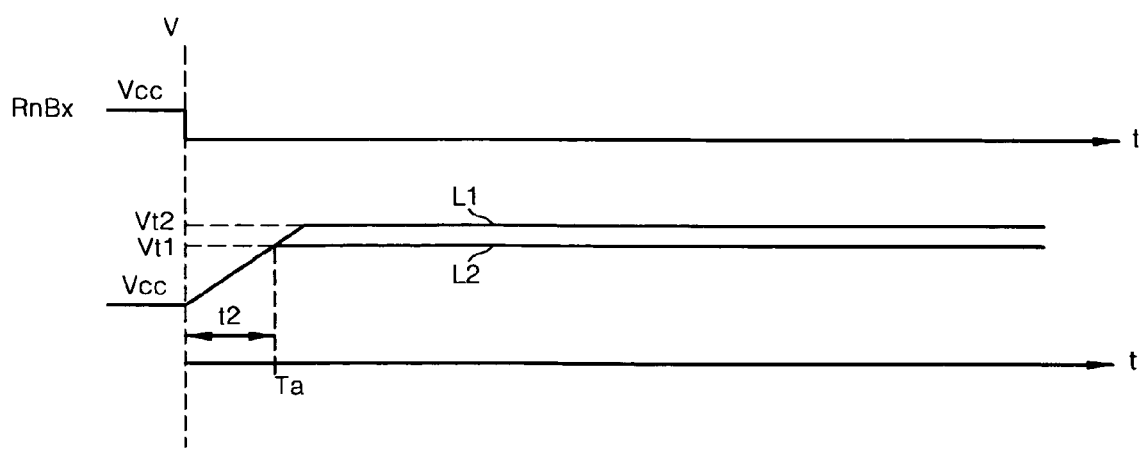
FIG. 2 is a graph illustrating the levels of an output voltage in the semiconductor device illustrated in FIG. 1.

FIG. 2 is a graph illustrating the levels of an output voltage in the semiconductor device 10 illustrated in FIG. 1. Referring to FIGS. 1 and 2, when the first voltage generation unit 20 and the second voltage generation unit 30 are activated, for example, when a read busy signal RnBx, which enables the operation of the semiconductor device 10, transitions from a high level of "1" to a low level of "0", the switch 42 is turned on and connects an output terminal NO3 of the first charge pump 24 with the output terminal NO5 of the second charge pump 34. In other words, during a period "t2" while the switch 42 is turned on, a level L1 of the first pump output voltage Vpp and a level L2 of the second pump output voltage Vpgm are increased together.

However, when the level L2 of the second pump output voltage Vpgm reaches a first target voltage level Vt1, i.e., at a point "Ta", the switch 42 is turned off and the output terminal NO3 of the first charge pump 24 is isolated from the output terminal NO5 of the second charge pump 34. In other words, when the second pump output voltage Vpgm reaches the first target voltage level Vt1, the second charge pump 34 stops charge pumping so that the second pump output voltage Vpgm is maintained at the first target voltage level Vt1. Meanwhile, the first charge pump 24 continues charge pumping to increase the first pump output voltage Vpp to a second target voltage level Vt2. Accordingly, overshoot (in which the level L2 of the second pump output voltage Vpgm is higher than the level L1) of the first pump output voltage Vpp, does not occur.

Figure 3:
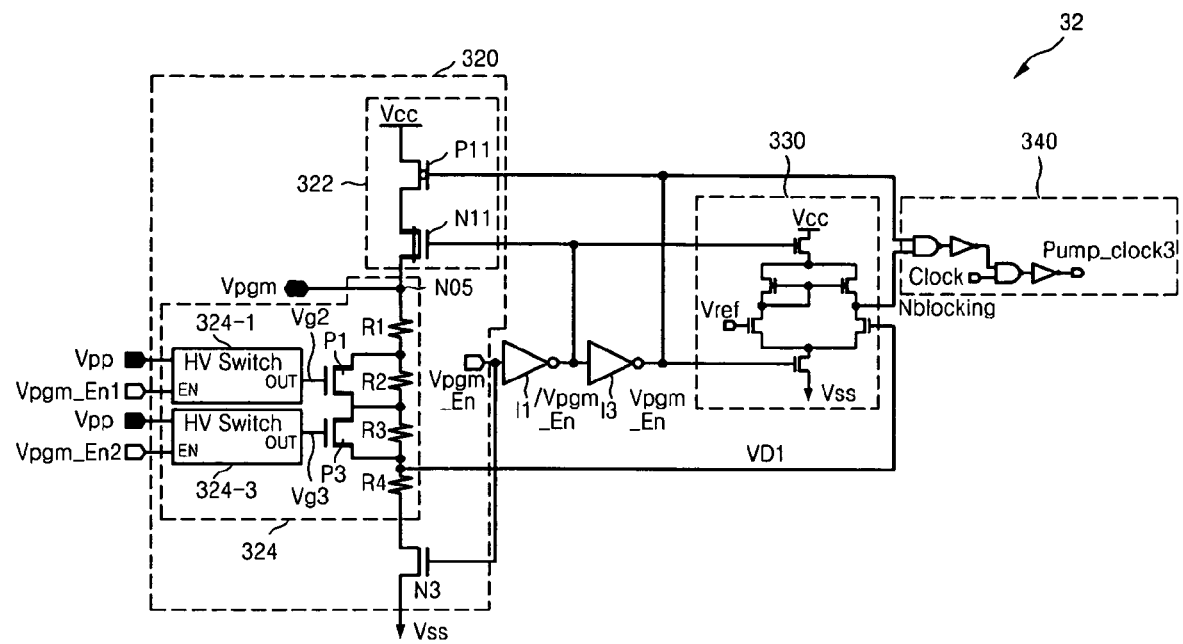
FIG. 3 is a circuit diagram of a pump clock generator illustrated in FIG. 1.

FIG. 3 is a circuit diagram of the second pump clock generator 32 illustrated in FIG. 1. Referring to FIGS. 1 and 3, the second pump clock generator 32 includes a divided voltage output block 320, a comparator 330, and a logic block 340.

The divided voltage output block 320 outputs the first power supply voltage Vcc, the second pump output voltage Vpgm, or a voltage obtained by dividing the second pump output voltage Vpgm based on the first pump output voltage Vpp and the second voltage generation enable signal Vpgm_En. The divided voltage output block 320 may include a number of components. For example, the disclosed divided voltage output block 320 includes the power supply voltage control circuit 322, a divider 324, and a switch N3.

The power supply voltage control circuit 322 biases the voltage of the output node NO5 of the second charge pump 34 to a level of the first power supply voltage Vcc when the second voltage generation enable signal Vpgm_En is deactivated. For example, when the second voltage generation enable signal Vpgm_En is deactivated to a low level of "0", the power supply voltage control circuit 322 operates such that the output node NO5 is at the level of the first power supply voltage Vcc. The power supply voltage control circuit 322 includes a PMOS transistor P11 and a depletion transistor N11.

The PMOS transistor P11 and the depletion transistor N11 are respectively turned on/off in response to the second voltage generation enable signal Vpgm_En and an inverted second voltage generation enable signal Npgm_En, which are respectively input through a second inverter I3 and a first inverter I1. More particularly, when the second voltage generation enable signal Vpgm_En is activated, both, the PMOS transistor P11 and the depletion transistor N11, are turned off and the output node NO5 is isolated from a node of the first power supply voltage Vcc. However, when the second voltage generation enable signal Vpgm_En is deactivated, both of the PMOS transistor P11 and the depletion transistor N11 are turned on and the output node NO5 is electrically connected with the node of the first power supply voltage Vcc. As a result, the output node NO5 is biased to the level of the first power supply voltage Vcc.

The divider 324 divides the second pump output voltage Vpgm based on the first pump output voltage Vpp and at least one of the first and second division control signals Vpgm_En1 and Vpgm_En2, respectively, and outputs a divided voltage. The divider 324 includes a first HV switch controller 324-1, a first switch P1, a second HV switch controller 324-3, a second switch P3, and first through fourth resistors R1 through R4. Each of the first and second switches P1 and P3 is connected in parallel with at least one of the first through fourth resistors R1 through R4 and may be implemented by a device such as, for example, a transistor.

The first HV switch controller 324-1 outputs a first switch control voltage Vg2 based on the first pump output voltage Vpp and the first division control signal Vpgm_En1. For example, when the first division control signal Vpgm_En1 is activated to a high level of "1", the first switch control voltage Vg2 has a level of the first pump output voltage Vpp and thus turns on the first switch P1. As a result, current flows to the first switch P1 instead of the second resistor R2. Because the current flow to the second resistor R2 is blocked, the second resistor R2 is disabled. However, when the first division control signal Vpgm_En1 is deactivated to the low level of "0", the first switch control voltage Vg2 has a level of a second power supply voltage Vss and thus turns off the first switch P1. As a result, current flows to the second resistor R2, which is enabled.

The second HV switch controller 324-3 outputs a second switch control voltage Vg3 based on the first pump output voltage Vpp and the second division control signal Vpgm_En2. The second switch P3 is connected between both ends of the third resistor R3 and blocks current flow to the third resistor R3 in response to the second switch control voltage Vg3 In other words, in a state in which the first through fourth resistors R1 through R4 are connected in series between the output node NO5 of the second charge pump 34 and the second power supply voltage Vss, the second pump output voltage Vpgm is divided by the on/off operation of the first and second switches P1 and P3.

The switch N3 is turned on or off in response to the second voltage generation enable signal Vpgm_En so as to selectively form an electrical path between the output node NO5 of the second charge pump 34 and the second power supply voltage Vss.

The comparator 330 compares an output voltage, i.e., a divided voltage VD1 output from the divided voltage output block 320 with the reference voltage Vref and generates a comparison signal, i.e., the first control signal Nblocking. For example, when the divided voltage VD1 is higher than the reference voltage Vref, the comparator 330 outputs the first control signal Nblocking at the low level of "0". On the other hand, when the divided voltage VD1 is lower than the reference voltage Vref, the comparator 330 outputs the first control signal Nblocking at the high level of "1".

The logic block 340 generates the second pump clock signal PUMP_clock3 having a predetermined cycle in response to the second voltage generation enable signal Vpgm_En, the first control signal Nblocking, and a clock signal "clock". Specifically, the logic block 340 performs an AND operation on the second voltage generation enable signal Vpgm_En and the first control signal Nblocking and then performs another AND operation on a result of the AND operation and the clock signal "clock", thereby generating the second pump clock signal PUMP_clock3.

For example, when the second voltage generation enable signal Vpgm_En is activated to the high level of "1" and when the first control signal Nblocking is provided at the high level of "1", that is, the divided voltage VD1 is lower than the reference voltage, the clock signal "clock" is output as the second pump clock signal PUMP_clock3. However, when second voltage generation enable signal Vpgm_En is deactivated or when the first control signal Nblocking is provided at the low level of "0", that is, the divided voltage VD1 is higher than the reference voltage, the second pump clock signal PUMP_clock3 remains at the low level of "0".

The structure and operation of the first pump clock generator 22 illustrated in FIG. 1 is the same as or similar to that of the second pump clock generator 32, with the exception that the first pump clock generator 22 operates in response to the first voltage generation enable signal Vpp_En, the first power supply voltage Vcc, a third division control signal Vpp_En1, and a fourth division control signal Vpp_En2, instead of the second voltage generation enable signal Vpgm_En, the first pump output voltage Vpp, the first division control signal Vpgm_En1, and the second division control signal Vpgm_En2. Thus, a detailed description of the first pump clock generator 22 will be omitted.

Figure 4:
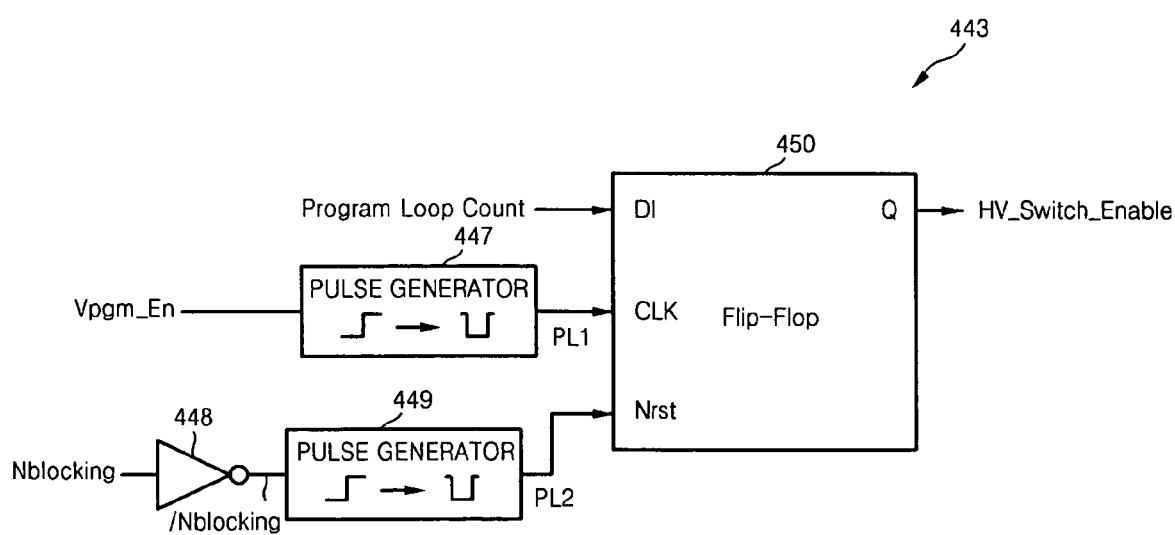
FIG. 4 is a circuit diagram of a control block illustrated in FIG. 1.

FIG. 4 is a circuit diagram of the control circuit 443 illustrated in FIG. 1. Referring to FIGS. 1 and 4, the control circuit 443 includes a first pulse generator 447, an inverter 448, a second pulse generator 449, and a flip-flop 450.

The first pulse generator 447 generates a first pulse PL1 based on the second voltage generation enable signal Vpgm_En. For example, the first pulse generator 447 may generate the first pulse PL1 having a predetermined period of the low level "0" in response to a rising edge of the second voltage generation enable signal Vpgm_En. Furthermore, the inverter 448 inverts the first control signal Nblocking.

The second pulse generator 449 generates a second pulse PL2 based on an inverted first control signal /Nblocking. For example, the second pulse generator 449 may generate the second pulse PL2 having a predetermined period of the low level "0" in response to a rising edge of the inverted first control signal /Nblocking.

The flip-flop 450 latches an input signal, i.e., the program loop count based on the first pulse PL1 and outputs the third control signal HV_Switch_Enable. The flip-flop 450 includes an input terminal DI receiving the program loop count, a clock terminal CLK receiving the first pulse PL1, and a reset terminal Nrst receiving the second pulse PL2. The program loop count may be a signal that activates the semiconductor device 10 to a program state.

Figure 5:
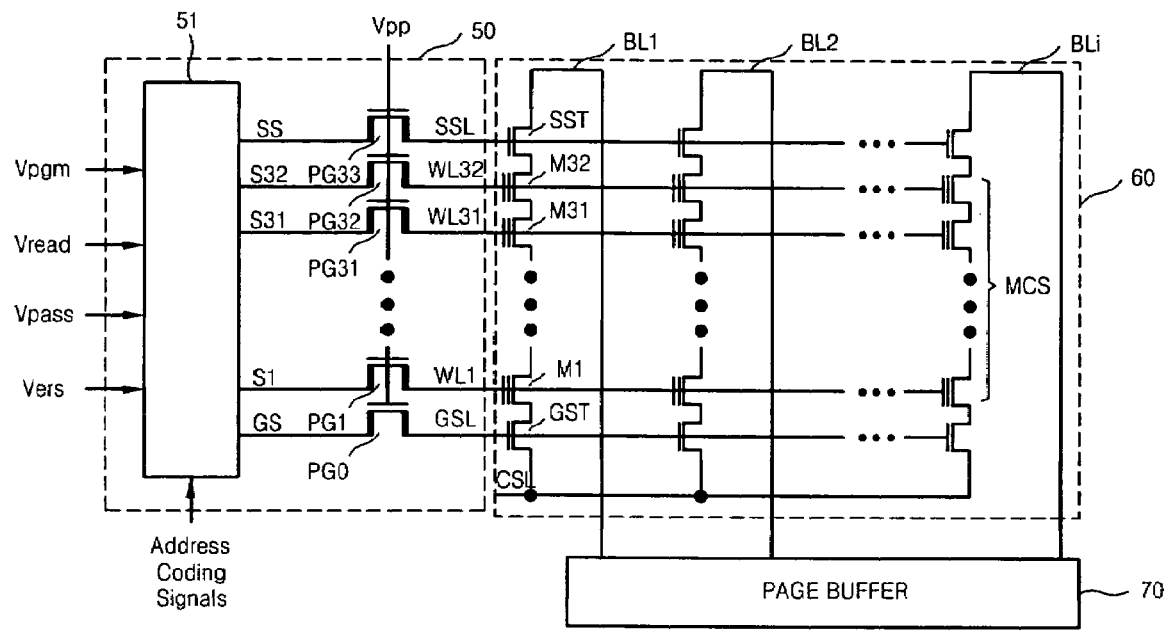
FIG. 5 illustrates a row decoder and a memory cell array included in a semiconductor device according to an exemplary disclosed embodiment.

FIG. 5 illustrates the row decoder circuit 50 and a memory cell array 60 included in a semiconductor device according to an exemplary disclosed embodiment. In particular, the semiconductor device illustrated in FIG. 5 is an example of a flash memory device.

Referring to FIG. 5, the memory cell array 60 may be connected with the row decoder circuit 50 through a plurality of row lines SSL, WL32 through WL1, and GSL and may be further connected with a page buffer 70 through a plurality of bit lines BL1, BL2 . . . BLi.

The row decoder circuit 50 receives the first and second pump output voltages Vpp and Vpgm, respectively, the read voltage Vread, the pass voltage Vpass, the erase voltage Vers, and the address coding signals. Furthermore, the row decoder circuit 50 outputs the second pump output voltage Vpgm (e.g., a program voltage), the read voltage Vread, the pass voltage Vpass, or the erase voltage Vers to one of the row lines SSL, WL32 through WL1, and GSL based on the address coding signals. To this end, the row decoder circuit 50 may include a row line voltage selector 51 and a plurality of transistors PG0 through PG33.

The row line voltage selector 51 selects and outputs row line selection voltages SS, S32, S31, . . . , S1, GS, which will be respectively applied to the row lines SSL, WL32 through WL1, and GSL using a plurality of generated voltages, i.e., the second pump output voltage Vpgm, the read voltage Vread, the pass voltage Vpass, and the erase voltage Vers. Specifically, the plurality of the transistors PG0 through PG33 are turned on/off in response to the first pump output voltage Vpp so that the row line selection voltages SS, S32 through S1, and GS are respectively output to the row lines SSL, WL32 through WL1, and GSL.

The memory cell array 60 includes a plurality of bit lines BL1 through BLi and memory cell strings MCS respectively connected with the bit lines BL1 through BLi. Each of the memory cell strings MCS includes a plurality of (e.g., 32) cell transistors M1 through M32, which are connected in series between a source of a string selection transistor SST and a drain of a ground selection transistor GST. A drain of each of string selection transistors SST is connected with a corresponding bit line BLj (where j=1 through i) and a source of each of ground selection transistors GST is connected with a common source line CSL. In addition, gates of the string selection transistors SST are connected with the string selection line SSL in common and gates of the ground selection transistors GST are connected with the ground selection line GSL in common. Furthermore, control gates of the cell transistors M1 in the memory cell strings MCS are connected with the word line WL1 in common. In the same manner, control gates of the other cell transistors M2 through M32 in the memory cell strings MCS are connected with the word lines WL2 through WL32, respectively, in common. Moreover, the row lines, i.e., the string selection line SSL, the word lines WL32 through WL1, and the ground selection line GSL within the memory cell array 60 respectively, receive the row line selection voltages SS, S32 through S1, and GS through the transistors PG33 through PG1, which are turned on/off in response to the first pump output voltage Vpp.

Figure 6:
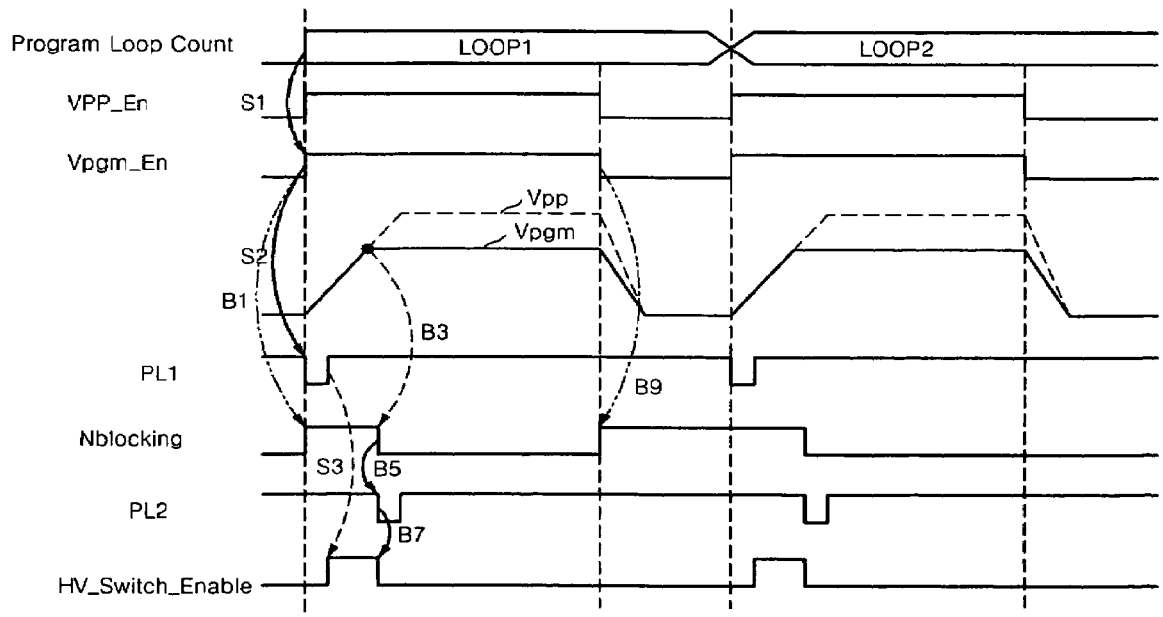
FIG. 6 is a timing chart for explaining the operations of the semiconductor device illustrated in FIG. 1.

FIG. 6 is a timing chart for explaining the operations of the semiconductor device 10 illustrated in FIG. 1. Referring to FIGS. 1, 4, and 6, the program loop count, which activates the semiconductor device 10 to the program state, the first voltage generation enable signal Vpp_En, and the second voltage generation enable signal Vpgm_En are activated (S1). The program loop count and the signals Vpp_En and Vpgm_EN may be generated by a controller (not shown) or may be internally generated in the semiconductor device 10 in response to a command signal received from the controller.

The first pulse generator 447 generates the first pulse PL1 in response to a rising edge of the second voltage generation enable signal Vpgm_En (S2). In addition, the flip-flop 450 latches the program loop count based on the first pulse PL1 received through the clock terminal CLK and outputs the third control signal HV_Switch_Enable at the high level of "1" (S3).

The first HV switch 441 activates the second control signal Vg1 in response to the third control signal HV_Switch_Enable provided at the high level of "1". Accordingly, the switch 42 is turned on. When the switch 42 is turned on, the output terminal NO3 of the first charge pump 24 is connected with the output terminal NO5 of the second charge pump 32. In other words, while the switch 42 is turned on, the first pump output voltage Vpp and the second pump output voltage Vpgm are increased together.

Furthermore, the first control signal Nblocking is output from the comparator 330. In addition, the comparator 330 outputs the first control signal Nblocking at the low level "0" when the divided voltage VD1 output from the divider 324 is higher than the reference voltage Vref and outputs the first control signal Nblocking at the high level "1" when the divided voltage VD1 is lower than the reference voltage Vref. Accordingly, when the second voltage generation enable signal Vpgm_En is activated, the first control signal Nblocking is maintained at the high level of "1" until the divided voltage VD1 output from the divider 324 is equal to the reference voltage Vref (B1).

When the divided voltage VD1 output from the divider 324 becomes equal to the reference voltage Vref, the first control signal Nblocking transits from the high level "1" to the low level "0" (B3). When the first control signal Nblocking transits from the high level "1" to the low level "0", the inverter 448 outputs the inverted first control signal /Nblocking, which transits from the low level "0" to the high level "1" and thus the second pulse PL2 is generated (B5). Then, the flip-flop 450 is reset in response to the second pulse PL2 received through the reset terminal Nrst and the third control signal HV_Switch_Enable transits from the high level of "1" to the low level of "0" (B7).

The first HV switch 441 deactivates the second control signal Vg1 in response to the third control signal HV_Switch_Enable provided at the low level of "0". Accordingly, the switch 42 is turned off. When the switch 42 is turned off, the output terminal NO3 of the first charge pump 24 is isolated from the output terminal NO5 of the second charge pump 34.

In other words, when the second pump output voltage Vpgm reaches the level of the reference voltage Vref, the second charge pump 34 stops charge pumping so that the second pump output voltage Vpgm is maintained at the level of the reference voltage Vref while the first charge pump 24 continues charge pumping. Furthermore, when the second voltage generation enable signal Vpgm_En is deactivated, the first control signal Nblocking transits from the low level of "0" to the high level of "1" (B9).

Figure 7:
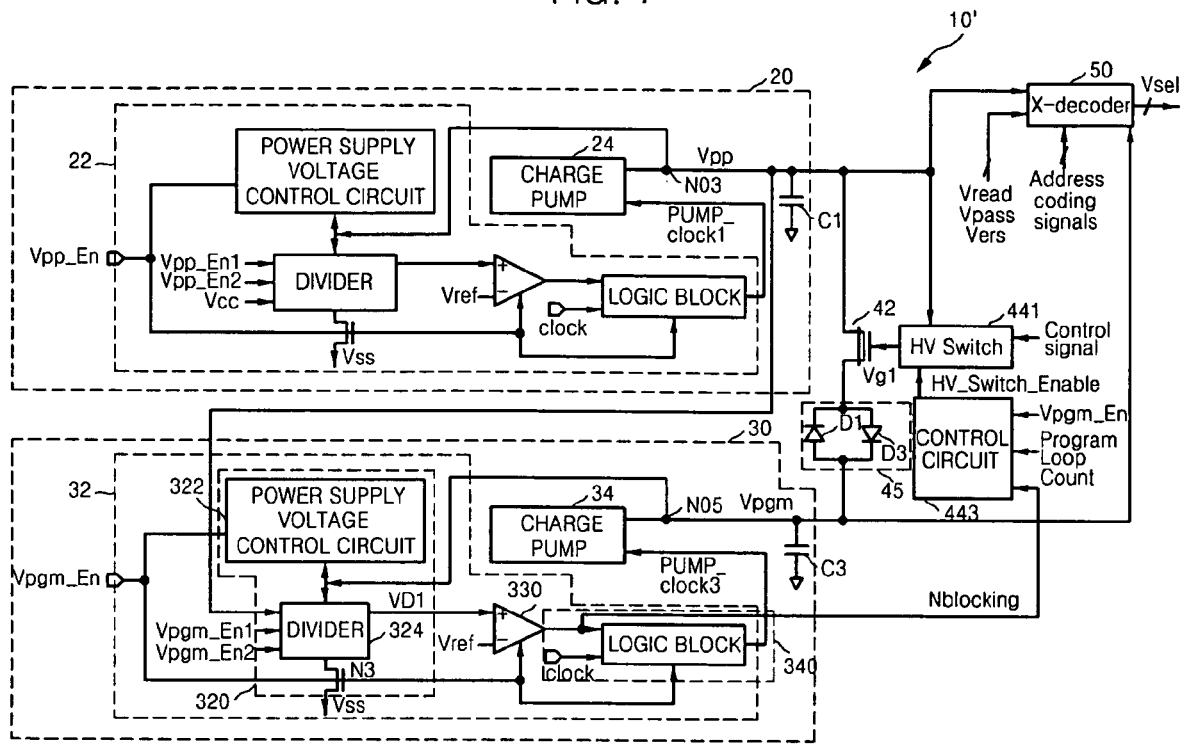
FIG. 7 is a block diagram of a semiconductor device according to an alternative exemplary disclosed embodiment.

FIG. 7 is a block diagram of a semiconductor device 10' according to an alternative exemplary disclosed embodiment. Referring to FIGS. 1 and 7, the structure and the operation of the semiconductor device 10' illustrated in FIG. 7 is the same or very similar to that of the semiconductor device 10 illustrated in FIG. 1, with the exception that the semiconductor device 10' further includes a diode unit 45.

The diode unit 45 includes one or more diodes such as, for example, first and second diodes D1 and D3. Furthermore, the switch 42 may be implemented by a depletion transistor, the threshold voltage of which is set to a predetermined value during the design stage of the transistor.

In an exemplary embodiment, the diode unit 45 prevents the switch 42 from being turned on when the switch 42 is supposed to be turned off. For example, when a voltage of a first terminal NO3 of the switch 42 should be higher than a voltage of a second terminal NO5 of the switch 42, that is, when the first voltage generation enable signal Vpp_En is activated while the second voltage generation enable signal Vpgm_En is deactivated, the switch 42 should be turned off. However, the switch 42 may be implemented by a depletion transistor which may have a threshold voltage of about −2.5 V. At this time, when the first power supply voltage Vcc is about 2.0 V, the absolute value, i.e., 2.5 V of the threshold voltage of the depletion transistor 42 is higher than the first power supply voltage Vcc. In this case, current flows between a source and a drain of the depletion transistor 42. In other words, current may flow in the switch 42 despite the need for switch 42 to be turned off.

The first diode D1 is not turned on as long as a first threshold voltage, i.e., a threshold voltage of first diode D1 is not applied and thus serves to increase the voltage of the source of the depletion transistor 42 to be higher than the voltage of the second terminal NO5 by the first threshold voltage. Accordingly, when the first voltage generation enable signal Vpp_En is activated and the second voltage generation enable signal Vpgm_En is deactivated, the switch 42 is prevented from being turned on.

The second diode D3 is not turned on as long as a second threshold voltage, i.e., a threshold voltage of the second diode D3 is not applied and thus serves to increase the voltage of the second terminal NO5 to be higher than the voltage of the source of the depletion transistor 42 by the second threshold voltage.

Figure 8:
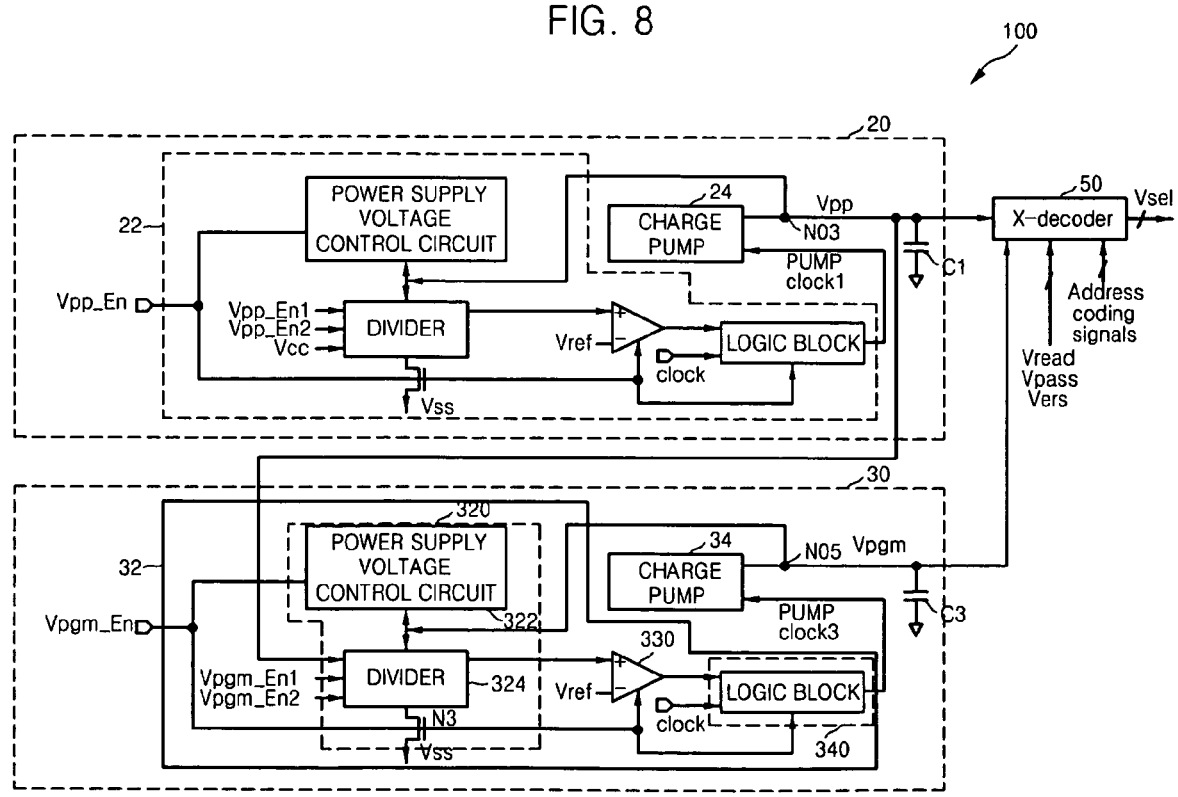
FIG. 8 is a block diagram of a semiconductor device to provide a comparison with exemplary disclosed embodiments.
Figure 9:
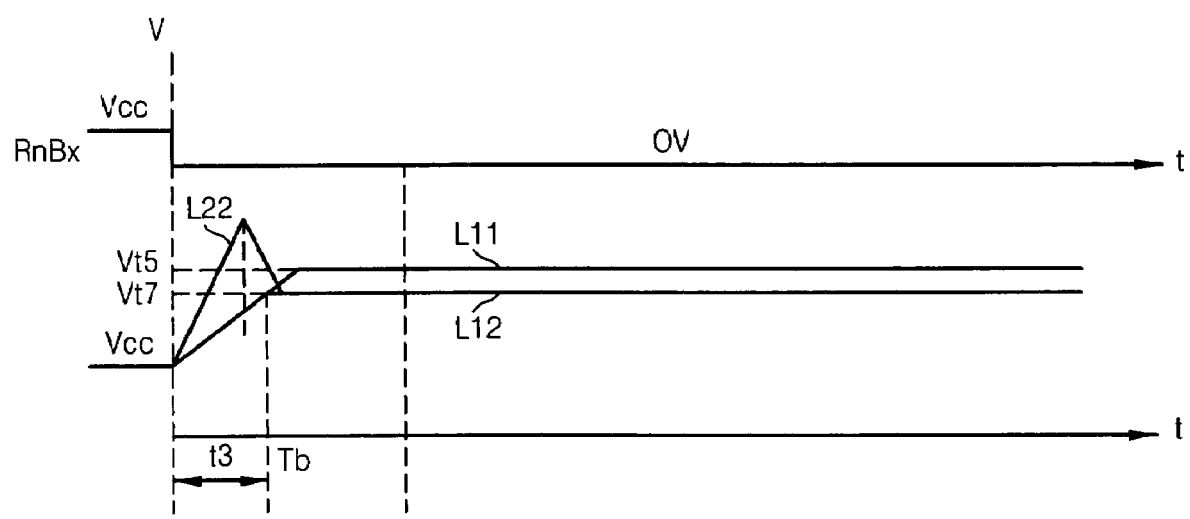
FIG. 9 is a graph illustrating the levels of an output voltage in the semiconductor device illustrated in FIG. 8.

FIG. 8 is a block diagram of a semiconductor device 100. Specifically, semiconductor device 100 is discussed to compare semiconductor device 100 with disclosed exemplary embodiments. FIG. 9 is a graph illustrating the levels of an output voltage in the semiconductor device 100 illustrated in FIG. 8. Referring to FIGS. 1, 8 and 9, the structure and the operation of the semiconductor device 100 illustrated in FIG. 8 is the same as or similar to that of the semiconductor device 10 illustrated in FIG. 1, with the exception that the semiconductor device 100 does not include the switching unit 40.

When the first voltage generation unit 20 and the second voltage generation unit 30 are activated, the first pump output voltage Vpp and the second pump output voltage Vpgm are increased.

In the semiconductor device 100 illustrated in FIG. 8, when a capacitance of a load capacitor C1 at the output terminal NO3 of the first charge pump 24, (e.g., a parasitic capacitance of a bus line) is greater than a capacitance of a load capacitor C3 at the output terminal NO5 of the second charge pump 32, the second pump output voltage Vpgm may be increased more quickly than the first pump output voltage Vpp. For example, before a level L11 of the first pump output voltage Vpp reaches a first target voltage Vt5, a level L22 of the second pump output voltage Vpgm may increase suddenly and become higher than a second target voltage Vt7, thus causing an overshoot of the output voltage.

However, in the semiconductor device 10 illustrated in FIG. 1, the switch 42 is turned on and connects the output terminal NO3 of the first charge pump 24 with the output terminal NO5 of the second charge pump 34 during a period "t3", and therefore, the level L11 of the first pump output voltage Vpp and a level L12 of the second pump output voltage Vpgm are increased together. When the level L12 of the second pump output voltage Vpgm reaches the second target voltage Vt7, that is, at a point "Tb", the switch 42 is turned off and isolates the output terminal NO3 of the first charge pump 24 from the output terminal NO5 of the second charge pump 34. In other words, when the level L12 of the second pump output voltage Vpgm reaches the second target voltage Vt7, the second charge pump 34 stops charge pumping so that the second pump output voltage Vpgm is maintained at the second target voltage Vt7 while the second charge pump 24 continues charge pumping so that the first pump output voltage Vpp is increased to the first target voltage Vt5. As a result, overshoot, in which the level L12 of the second pump output voltage Vpgm is higher than the level L11 of the first pump output voltage Vpp, does not occur.

The disclosed system can be used in any voltage generation circuit where an output voltage has to be maintained at a desired level. Specifically, the disclosed switching unit can connect a first voltage generation circuit with a second voltage generation circuit, whereby erroneous operations of a semiconductor device and overshoot may be prevented.

While the disclosed system has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A semiconductor device comprising:
   a first pump clock generator configured to generate a first pump clock signal based on a power supply voltage;
   a first charge pump configured to generate a first pump output voltage in response to the first pump clock signal;
   a second pump clock generator configured to generate a second pump clock signal based on the first pump output voltage;
   a second charge pump configured to generate a second pump output voltage in response to the second pump clock signal; and
   a switching unit configured to selectively connect the first charge pump to the second charge pump.

2. The semiconductor device of claim 1, wherein the switching unit comprises:
   a switch connected between the first charge pump and the second charge pump, the switch being turned on or off in response to a second control signal; and
   a switch control block configured to output the second control signal based on the first pump output voltage and a first control signal generated by the second pump clock generator.

3. The semiconductor device of claim 2, wherein the switch control block comprises:
   a first control block configured to output the second control signal based on the first pump output voltage and a third control signal; and
   a second control block configured to output the third control signal based on an enable signal which activates the second pump clock generator and the first control signal.

4. The semiconductor device of claim 3, wherein the second control block comprises:
   a first pulse generator configured to generate a first pulse based on the enable signal;
   a second pulse generator configured to generate a second pulse based on the first control signal; and
   a flip-flop configured to latch an input signal based on the first pulse and to output the third control signal, and
   wherein the flip-flop is reset in response to the second pulse.

5. The semiconductor device of claim 4, wherein the input signal is a signal that activates the semiconductor device to a program state.

6. The semiconductor device of claim 2, wherein the switch is a depletion transistor.

7. The semiconductor device of claim 2, further comprising at least one diode connected between the switch and the second charge pump.

8. The semiconductor device of claim 2, wherein the second pump clock generator comprises:
   a divided voltage output block connected to the second charge pump and configured to output the power supply voltage, the second pump output voltage or a voltage obtained by dividing the second pump output voltage;
   a comparator configured to compare an output voltage of the divided voltage output block with a reference voltage and, based on the comparison, to generate the first control signal; and
   a logic block configured to generate the second pump clock signal having a predetermined cycle, in response to an enable signal which activates the second pump clock generator and the first control signal.

9. The semiconductor device of claim 8, wherein the divided voltage output block comprises:
   a power supply voltage control circuit configured to control an output node of the second charge pump to be at a level of the power supply voltage when the enable signal is deactivated;
   a divider configured to divide a voltage of the output node of the second charge pump based on the first pump output voltage and the enable signal and to output a divided voltage; and
   a switch configured to connect the output node of the second charge pump and a second power supply voltage in response to the enable signal.

10. The semiconductor device of claim 1, further comprising a row decoder circuit connected with a memory cell array in the semiconductor device through a plurality of row lines, the row decoder circuit configured to receive the first pump output voltage, the second pump output voltage, and address signals, and to output the second pump output voltage to at least one row line based on the address signals.

11. The semiconductor device of claim 10, wherein the semiconductor device is a flash memory device, and
   wherein the second pump output voltage is a program voltage used to write data into at least one memory cell in the memory cell array or an erase voltage used to erase the data from the memory cell.

12. The semiconductor device of claim 10, wherein the row decoder circuit comprises a transistor which is turned on based on the first pump output voltage to output the second pump output voltage to the at least one row line.

13. A method of generating a voltage in a semiconductor device, the method comprising:
   generating a first pump clock signal based on a power supply voltage using a first pump clock generator;
   generating a first pump output voltage in response to the first pump clock signal using a first charge pump;
   generating a second pump clock signal based on the first pump output voltage using a second pump clock generator;

generating a second pump output voltage in response to the second pump clock signal using a second charge pump; and selectively connecting the first charge pump to the second charge pump.

14. The method of claim 13, wherein connecting the first charge pump to the second charge pump comprises:

outputting a second control signal based on the first pump output voltage and a first control signal generated by the second pump clock generator; and turning on a switch, which is provided between the first charge pump and the second charge pump, in response to the second control signal.

* * * * *